(12) United States Patent
Huang et al.

(10) Patent No.: US 10,020,312 B2
(45) Date of Patent: Jul. 10, 2018

(54) STATIC RANDOM ACCESS MEMORY

(71) Applicant: TAIWAN SEMICONDUCTOR MANUFACTURING CO., LTD., Hsinchu (TW)

(72) Inventors: Huai-Ying Huang, Jhonghe (TW); Jordan Hsu, Hsinchu (TW); Tang-Hsuan Chung, Kaohsiung (TW); Shau-Wei Lu, Taoyuan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/158,103

(22) Filed: May 18, 2016

(65) Prior Publication Data

US 2017/0338233 A1 Nov. 23, 2017

(51) Int. Cl.
*H01L 27/11* (2006.01)
*H01L 23/528* (2006.01)
(Continued)

(52) U.S. Cl.
CPC ........ *H01L 27/1104* (2013.01); *G11C 11/412* (2013.01); *G11C 11/419* (2013.01); *H01L 23/528* (2013.01); *H01L 27/0207* (2013.01); *H01L 27/0924* (2013.01); *H01L 23/53209* (2013.01); *H01L 23/53228* (2013.01); *H01L 23/53257* (2013.01)

(58) Field of Classification Search
CPC ......... H01L 21/76816; H01L 23/49838; H01L 23/528; H01L 23/5386; H01L 27/0207; H01L 27/0611; H01L 27/0688; H01L 27/11504; H01L 27/11519; H01L 27/11565; H01L 27/1203; H01L 27/2463; H01L 27/2481; H01L 27/281; H01L 27/1104; H01L 27/0924; H01L 23/53209; H01L 23/53228; H01L 23/53257; G11C 11/412; G11C 11/419
See application file for complete search history.

(56) References Cited

U.S. PATENT DOCUMENTS 9,424,889 B1* 8/2016 Liaw .................. G11C 5/06
2008/0247221 A1* 10/2008 Houston ............. G11C 11/412
365/154

(Continued)

*Primary Examiner* — Bitew Dinke
(74) *Attorney, Agent, or Firm* — McDermott Will & Emery LLP

(57) ABSTRACT

A Static Random Access Memory (SRAM) Cell includes a first gate electrode layer covering a channel region of a read pull-down transistor, a second gate electrode layer covering channel regions of a first pull-down transistor and a first pull-up transistor, a third gate electrode layer covering a channel region of a second pass-gate transistor, a fourth gate electrode layer covering a channel region of a read pass-gate transistor, a fifth gate electrode layer covering a channel region of a first pass-gate transistor, and a sixth gate electrode layer covering channel regions of a second pull-down transistor and a second pull-up transistor. The first and second gate electrode layers are separated from each other by a first dielectric layer interposed therebetween, and are electrically connected to each other by a first interconnection layer formed thereon.

19 Claims, 7 Drawing Sheets

(51) Int. Cl.
*H01L 27/092* (2006.01)
*H01L 27/02* (2006.01)
*G11C 11/419* (2006.01)
*G11C 11/412* (2006.01)
*H01L 23/532* (2006.01)

(56) References Cited

U.S. PATENT DOCUMENTS

| | | | | |
|---|---|---|---|---|
| 2011/0068400 A1* | 3/2011 | Wang | ............ | G11C 11/412 257/347 |
| 2011/0068413 A1* | 3/2011 | Liaw | ............ | G11C 11/412 257/393 |
| 2011/0317477 A1* | 12/2011 | Liaw | ............ | G11C 8/16 365/156 |
| 2012/0108036 A1* | 5/2012 | Chang | ............ | H01L 27/1104 438/478 |
| 2013/0026571 A1* | 1/2013 | Kawa | ............ | H01L 27/0207 257/347 |
| 2013/0154027 A1* | 6/2013 | Liaw | ............ | H01L 27/1104 257/390 |
| 2013/0235640 A1* | 9/2013 | Liaw | ............ | G11C 11/412 365/63 |
| 2013/0258759 A1* | 10/2013 | Liaw | ............ | G11C 11/412 365/154 |
| 2014/0078817 A1* | 3/2014 | Bentum | ............ | G11C 11/412 365/154 |
| 2014/0185365 A1* | 7/2014 | Liaw | ............ | G11C 11/419 365/154 |
| 2014/0347908 A1* | 11/2014 | Liaw | ............ | G11C 11/412 365/72 |
| 2015/0016173 A1* | 1/2015 | Liaw | ............ | H01L 21/76895 365/72 |
| 2015/0054078 A1* | 2/2015 | Xie | ............ | H01L 29/785 257/347 |
| 2015/0302917 A1* | 10/2015 | Grover | ............ | G11C 11/412 365/51 |
| 2016/0133632 A1* | 5/2016 | Park | ............ | H01L 27/0207 257/369 |
| 2016/0284705 A1* | 9/2016 | Chung | ............ | H01L 27/0924 |
| 2016/0372316 A1* | 12/2016 | Yang | ............ | H01L 27/0924 |
| 2017/0025511 A1* | 1/2017 | Lee | ............ | H01L 29/0649 |

* cited by examiner

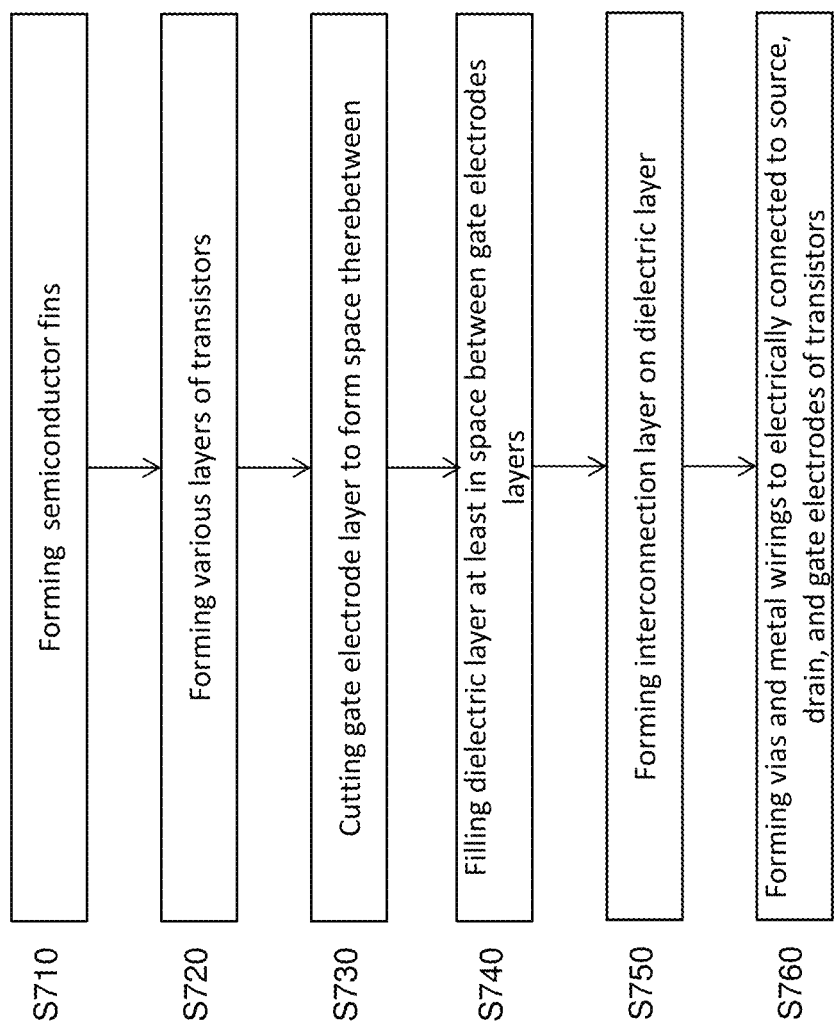

STATIC RANDOM ACCESS MEMORY

TECHNICAL FIELD

The present disclosure is generally related to a static random access memory (SRAM), and more particularly, an SRAM having improved layout so as to lower a minimum operating voltage.

BACKGROUND

A static random access memory (SRAM) is commonly used for data storage when the SRAM is supplied with power. To meet the demand in portable electronics and high speed computation, it is desirable to integrate more data storage cells including cross-coupled invertors into a single SRAM chip and to lower power consumption thereof, for example, by replacing conventional transistors with fin field-effect transistors (FinFET) having smaller size and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 shows a flowchart of a method for manufacturing an SRAM array according to an embodiment of the present disclosure.

DETAILED DESCRIPTION

Figure 1:
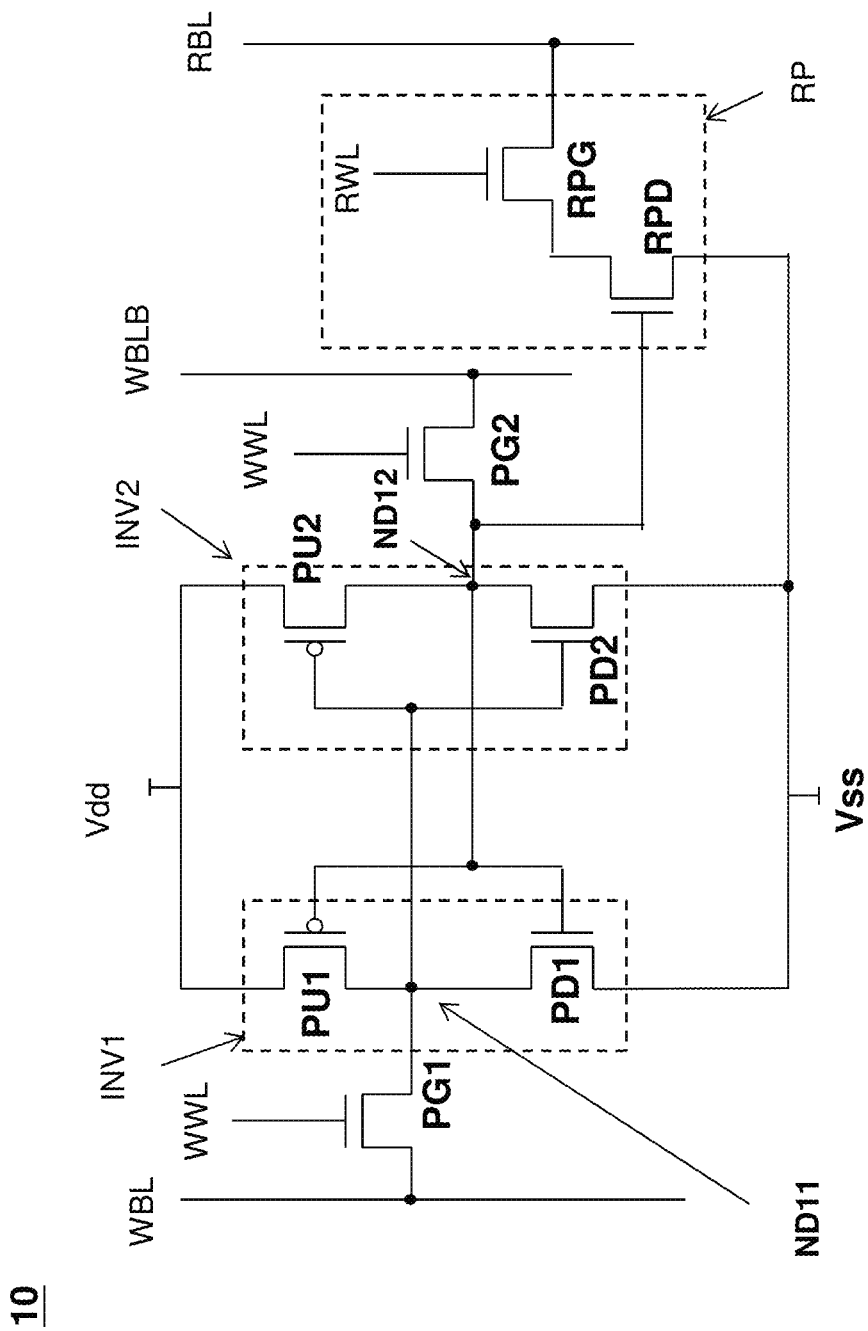
FIG. 1 is an exemplary circuit diagram of an eight-transistor (8T) SRAM cell according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that specifying source and drain regions, and source and drain electrodes of the same transistor in the present disclosure is merely to distinguish the source and drain regions from each other and to distinguish the source and drain electrodes from each other. The source and drain regions of the same transistor can be alternatively referred to as drain and source regions, respectively, and the source and drain electrodes of the same transistor can be alternatively referred to as drain and source electrodes, respectively.

In the present disclosure, when gate electrodes of two or more transistors are formed by the same layer and are thus electrically connected to each other by the same layer, the same layer is referred to as a gate electrode layer.

FIG. 1 is an exemplary circuit diagram of an 8T SRAM cell according to an embodiment of the present disclosure.

Referring to FIG. 1, an 8T SRAM cell 10 includes a first pull-up transistor PU1 and a first pull-down transistor PD1 forming a first inverter INV1, a second pull-up transistor PU2 and a second pull-down transistor PD2 forming a second inverter INV2 cross-coupled with the first inverter INV1, first and second pass-gate transistors PG1 and PG2 configured to write data to be stored by the cross-coupled first and second inverters INV1 and INV2, respectively, a read pull-down transistor RPD and a read pass-gate transistor RPG forming a read port RP to access data stored by the cross-coupled first and second inverters INV1 and INV2.

Drain electrodes of the first pull-up transistor PU1, the first pull-down transistor PD1, and the first pass-gate transistor PG1 are electrically connected at a first data storage node ND11. Drain electrodes of the second pull-up transistor PU2, the second pull-down transistor PD2, and the second pass-gate transistor PG2 are electrically connected at a second data storage node ND12.

Gate electrodes of the second pull-up transistor PU2 and the second pull-down transistor PD2 are electrically connected to the drain electrodes of the first pull-down transistor PD1, the first pass-gate transistor PG1, and the first pull-up transistor PU1 through the first data storage node ND11, while gate electrodes of the first pull-up transistor PU1 and the first pull-down transistor PD1 are electrically connected to the drain electrodes of the second pull-down transistor PD2, the second pass-gate transistor PG2, and the second pull-up transistor PU2 through the second data storage node ND12.

Source electrodes of the first and second pull-down transistors PD1 and PD2 are connected to a first power supply node Vss, while source electrodes of the first and second pull-up transistors PU1 and PU2 are connected to a second power supply node Vdd. According to one embodiment, the first power supply node Vss is electrically connected to a ground, and the second power supply node Vdd is electrically connected to a positive electrical potential, supplied from a power supply circuit (not shown) of the SRAM.

Gate electrodes of the first and second pass-gate transistors PG1 and PG2 are connected to a write wordline WWL. Source electrodes of the first and second pass-gate transistors PG1 and PG2 are connected to first and second write bitlines WBL and WBLB, respectively.

The read pass-gate transistor RPG and the read pull-down transistor RPD are connected in series between a read bitline RBL and the first power supply node Vss. The read pull-down transistor RPD has a gate electrode electrically connected to the second data storage node ND12. A gate electrode of the read pass-gate transistor RPG connected to a read wordline RWL is configured to control reading of the data stored by the cross-coupled first and second inverters INV1 and IV2 by way of the conduction state of the read pull-down transistor RPD to the read bitline RBL.

As shown in FIG. 1, the first and second pass-gate transistors PG1 and PG2, the first and second pull-down transistors PD1 and PD2, the read pass-gate transistor RPG, and the read pull-down transistor RPD are first-type transistors, and the first and second pull-up transistors PU1 and PU2 are second-type transistors. The first-type transistors are N-type transistors and the second-type transistors are P-type transistors in some embodiments. The present disclosure is not limited thereto. According to another embodiment, the first-type transistors are P-type transistors and the first-type transistors are N-type transistors.

Figure 2:
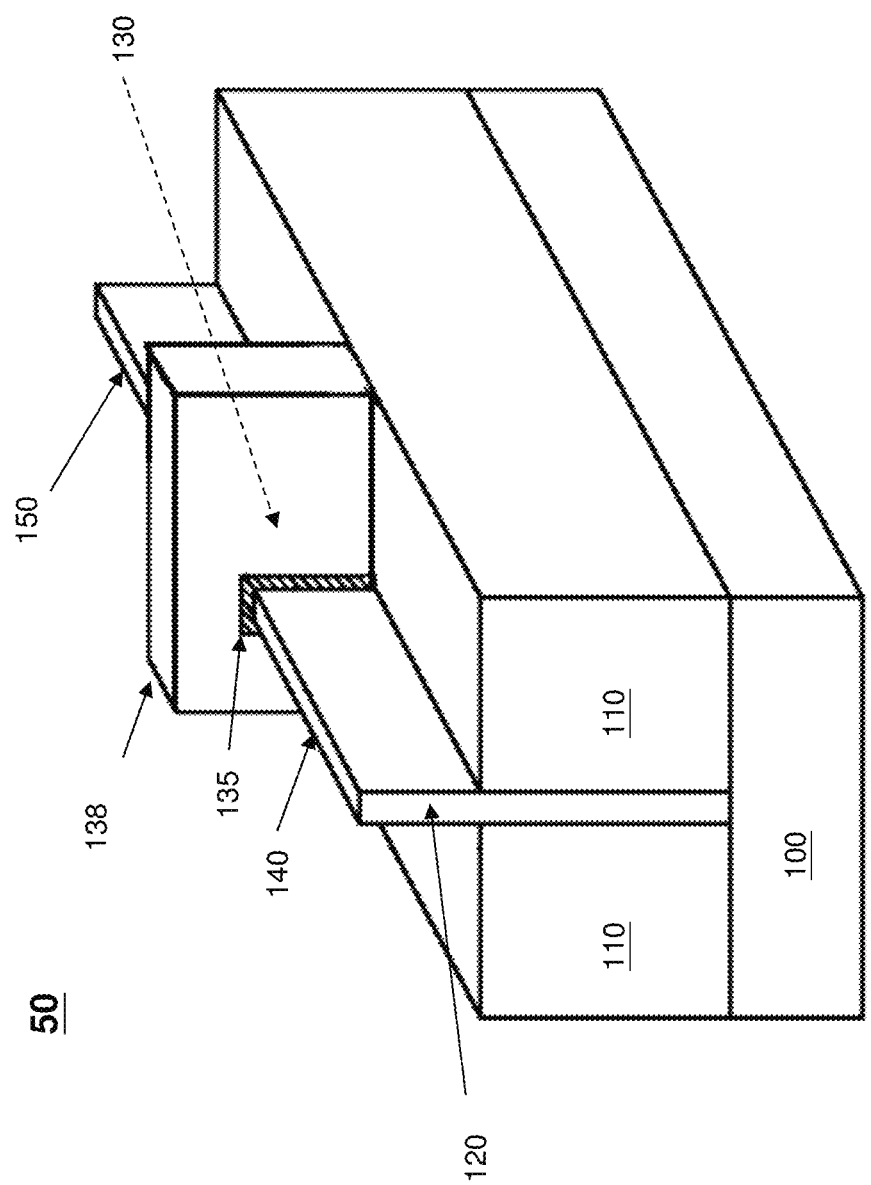
FIG. 2 is an exemplary perspective view of a fin field-effect transistor (FinFET) according to an embodiment of the present disclosure.

FIG. 2 is an exemplary perspective view of a fin field-effect transistor (FinFET) according to an embodiment of the present disclosure, which can be employed to implement the SRAM cell shown in FIG. 1.

Referring to FIG. 2, a FinFET 50 includes a semiconductor fin 120 formed, for example, of silicon, protruding from a substrate 100, for example, a silicon substrate. The semiconductor fin 120 can be a trench-etched substrate or grown by epitaxy. Alternatively, the semiconductor fin 120 can be made of a device layer of a silicon-on-insulator (SOI) substrate. A lower portion of the semiconductor fin 120 is interposed between isolation regions 110 formed over the substrate 100. The isolation regions 110 are Shallow Trench Isolation (STI) regions as an example to be described next. The present disclosure, however, is not limited thereto. The isolation regions 110 can be field oxide regions, according to another embodiment.

The FinFET 50 further includes a source region 140 and a drain region 150 and a channel region 130 interposed therebetween. The source region 140, the drain region 150, and the channel region 130 of the FinFET 50 are made of a top portion of the semiconductor fin 120 at a level above the isolation regions 110. The source and drain regions 140 and 150 are heavily doped and may contain impurities having a concentration in a range from about $5 \times 10^{19}$ to $1 \times 10^{20}$ $cm^{-3}$, while the channel region 130 is undoped or lightly doped.

A gate electrode 138 is made of one or more layers of metal material, such as W, or Co, and may further include other work function adjusting metals, is formed over the channel region 130, and extends to cover sidewalls of the channel region 130 and to cover portions of the isolation regions 110. The FinFET 50 also has a gate insulating layer 135 formed of, for example, a high-k dielectric material such as a metal oxide including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixture thereof. The gate insulating layer 135 is interposed between the gate electrode 138 and the channel region 130 to electrically isolate them from each other.

Although not shown in FIG. 2, according to some embodiments, two or more FinFETs may be formed primarily based on the same semiconductor fin 120. In this case, source and drain regions and channel regions of the two or more FinFETs may be formed by the same semiconductor fin 120. Thus, the drain regions (or the source regions), which are disposed between the channel regions of two immediately adjacent FinFETs, are directly coupled to each other.

It should be appreciated that metal contacts can be formed over the source and drain regions 140 and 150, and/or a gate layer contact can be formed over the gate electrode 138, to electrically connect the source and drain regions 140 and 150, and/or the gate electrode 138 to various metal layers such as bitlines, wordlines, and power supply nodes over the FinFET 50. Such features will be more apparent with reference to FIGS. 3 and 4 below.

Figure 3:
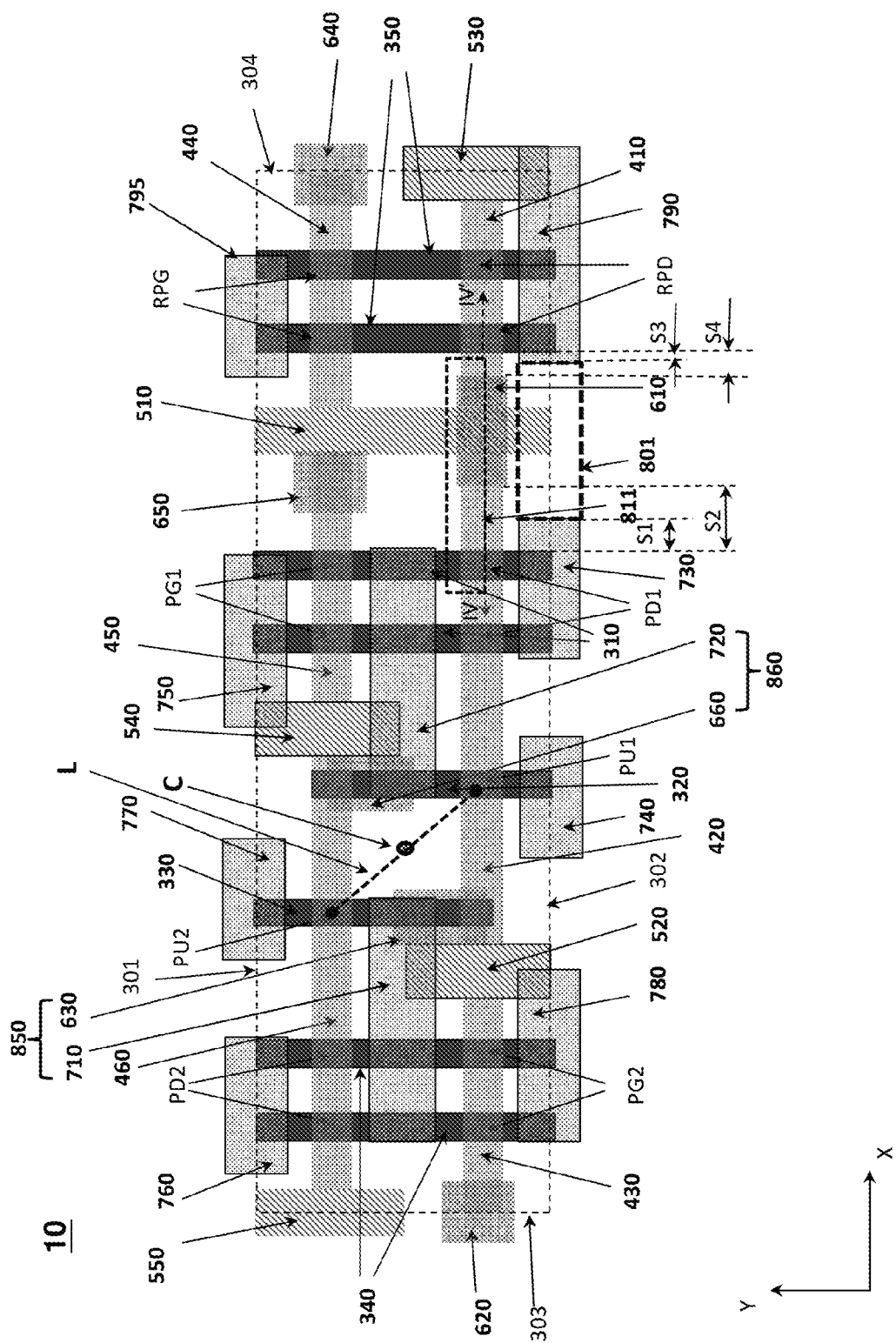
FIG. 3 illustrates an exemplary simplified layout of an 8T SRAM cell according to an embodiment of the present disclosure.

FIG. 3 illustrates an exemplary simplified layout of an 8T SRAM cell according to an embodiment of the present disclosure, in which only a layout of semiconductor fins, gate electrodes/layers, metal contacts formed on the semiconductor fins, and interconnection layers formed over the gate electrode/layers are illustrated. The aforementioned FinFET can be employed to implement various transistors of the SRAM cell.

Referring to FIG. 3, an 8T SRAM cell 10 is formed in a region defined by first and second boundaries 301 and 302 parallel to X axis and third and fourth boundaries 303 and 304 parallel to Y axis and intersected by the first and second boundaries 301 and 302. In the present embodiment, when a respective layer traverses one of the boundaries 301 through 304 of the 8T SRAM cell 10 or extends from one of the boundaries 301 through 304, the respective layer is symmetrically arranged with reference to the one boundary. That is, the 8T SRAM cell 10 and another 8T SRAM cell adjacent to 8T SRAM cell 10 in an SRAM array having the same boundary share the same respective layer which is continuous at the shared boundary. For example, a first semiconductor fin 310 extends continuously between the first and second boundaries 301 and 302 can further extend continuously to SRAM cells of the SRAM array adjacent to the SRAM cell 10 in Y axis.

As shown in FIG. 3, the 8T SRAM cell 10 includes the first semiconductor fin 310, a second semiconductor fin 320, a third semiconductor fin 330, and a fourth semiconductor fin 340 sequentially arranged in a direction opposite to X axis. The first and fourth semiconductor fins 310 and 340 each extend continuously between the first and second boundaries 301 and 302, while the second and third semiconductor fins 320 and 330 extends from one of the first and second boundaries but is spaced apart from the other one of the first and second boundaries 301 and 302.

Source, drain, and channel regions of a first pass-gate transistor PG1 and a first pull-down transistor PD1 of the 8T SRAM cell 10 are made of the first semiconductor fin 310. Source, drain, and channel regions of a second pass-gate transistor PG2 and a second pull-down transistor PD2 are made of the fourth semiconductor fin 340. Source, drain, and channel regions of a first pull-up transistor PU1 of the 8T SRAM cell 10, and source, drain, and channel regions of a second pull-up transistor PU2 of the 8T SRAM cell 10, are made of the second and third semiconductor fins 320 and 330, respectively.

The 8T SRAM cell 10 further includes a fifth semiconductor fin 350, similarly to the first and fourth semiconductor fins 310 and 340, continuously extending between the first and second boundaries 301 and 302. The first semiconductor fin 310 is arranged between the fifth semiconductor fin 350 and the second semiconductor fin 320. Source, drain, and channel regions of a read pull-down RPD and a read pass-gate transistor RPG of the 8T SRAM cell 10 are made of the fifth semiconductor fin 350.

Referring to FIG. 3, in some embodiments of the present disclosure, each of the first semiconductor fin 310, the fourth semiconductor fin 340, and the fifth semiconductor fin 350 includes a pair of parallel semiconductor fins, such that each of the first pass-gate transistor PG1, the first pull-down transistor PD1, the second pull-down transistor PD2, the second pass-gate transistor PG2, the read pass-gate transistor RPG, and the read pull-down transistor RPD is formed of two parallel connected sub-transistors, in which source, drain, and channel regions are arranged parallel to each other and the same gate electrode is formed over the two parallel channel regions.

The second pass-gate transistor PG2 and the second pull-down transistor PD2 of the 8T SRAM cell 10 have the drain regions thereof directly coupled to each other by a central portion of the fourth semiconductor fin 340. The drain region of the second pull-up transistor PU2 is connected to the coupled drain regions of the second pass-gate transistor PG2 and the second pull-down transistor PD2 through a first metal contact 710 of a first interconnection structure 850. The first pass-gate transistor PG1 and the first pull-down transistor PD1 of the 8T SRAM cell 10 have the drain regions thereof directly coupled to each other by a central portion of the first semiconductor fin 310. The drain region of the first pull-up transistor PU1 is connected to the coupled drain regions of the first pass-gate transistor PG1 and the first pull-down transistor PD1 through a second metal contact 720 of a second interconnection structure 860.

Still referring to FIG. 3, a third metal contact 730 traverses the second boundary 302 and is formed over the source region of the first pull-down transistor PD1, such that the source region of the first pull-down transistor PD1 can be electrically connected to a first power supply node (see Vss in FIG. 1) through the third metal contact 730. A fourth metal contact 740 traverses the second boundary 302 and is formed over the source region of the first pull-up transistor PU1, such that the source region of the first pull-up transistor PU1 can be electrically connected to a second power supply node (see Vdd in FIG. 1) through the fourth metal contact 740. A fifth metal contact 750 traverses the first boundary 301 and is formed over the source region of the first pass-gate transistor PG1, such that the source region of the first pass-gate transistor PG1 can be electrically connected to a first write bitline (see WBL in FIG. 1) disposed over the 8T SRAM cell 10 through the fifth metal contact 750.

A sixth metal contact 760 traverses the first boundary 301 and is formed over the source region of the second pull-down transistor PD2, such that the source region of the second pull-down transistor PD2 can be electrically connected to the second power supply node (see Vss in FIG. 1) through the sixth metal contact 760. A seventh metal contact 770 traverses the first boundary 301 and is formed over the source region of the second pull-up transistor PU2, so that the source region of the second pull-up transistor PU1 can be electrically connected to the second power supply node (see Vdd in FIG. 1) by the seventh metal contact 770. An eighth metal contact 780 is formed over the source region of the second pass-gate transistor PG2 and traverses the second boundary 302, so that the source region of the second pass-gate transistor PG2 can be electrically connected to a second write bitline (see WBLB in FIG. 1) disposed over the 8T SRAM cell 10 by the eighth metal contact 780.

The drain regions of the read pull-down RPD and the read pass-gate transistor RPG are directly coupled to each other by a central portion of the fifth semiconductor fin 350. A ninth metal contact 790 traverses the second boundary 302 and is formed over the source region of the read pull-down transistor RPD, such that the source region of the read pull-down transistor RPD can be electrically connected to the first power supply node (see Vss in FIG. 1) through the ninth metal contact 790. A tenth metal contact 795 traverses the first boundary 301 and is formed over the source region of the read pass-gate transistor RPG, such that the source region of the read pass-gate transistor RPG can be electrically connected to a read bitline (see RBL in FIG. 1) disposed over the 8T SRAM cell 10 through the tenth metal contact 795.

According to the present embodiment, the first through tenth metal contacts 710, 720, 730, 740, 750, 760, 770, 780, 790, and 795 are formed of a same metal layer during manufacturing. Thus, each of the metal contacts is formed at the same level with reference to a surface of a substrate on which the SRAM cell 10 is formed and contains the same material such as tungsten, cobalt, copper, or silicide thereof or a combination thereof. Each of the first through tenth metal contacts can directly contact a portion of the respective semiconductor fin so as to make an electrical connection thereof. Further, each of the third, fourth, eighth, and ninth metal contacts 730, 740, 780, and 790 that traverse the same second boundary 302 are spaced apart from each other and aligned to each other along the second boundary 302, and each of the fifth, sixth, seventh, and tenth metal contacts 750, 760, 770, and 795 that traverse the same first boundary 301 are spaced apart from each other and aligned to each other along the first boundary 301.

As show in FIG. 3, the 8T SRAM cell 10 has first through third gate electrode layers 410, 420, and 430 aligned to each other in X axis, which can be formed by cutting the same gate layer extending linearly along X axis during manufacturing. The first gate electrode layer 410 formed over the channel region of the read pull-down transistor RPD, and the second gate electrode layer 420 formed over the channel regions of the first pull-up transistor PU1 and the first pull down transistor PD1, are separated from each other by a first dielectric layer 510 filling the space therebetween. The second gate electrode layer 420, and the third gate electrode layer 430 formed over the channel region of the second pass-gate transistor PG2, are separated from each other by a second dielectric layer 520 filling the space therebetween. Further, the first gate electrode layer 410 is spaced apart from the fourth boundary 304 by the third dielectric layer 530 traversing the fourth boundary 304, while the third gate electrode layer 430 extends from the third boundary 303. As shown in FIG. 3, the second gate electrode layer 420 covers (but is not electrically connected to) the drain region of the second pull-up transistor PU2. The present disclosure is not limited thereto. According to another embodiment, the third semiconductor fin 130 has a shorter length in Y axis than that is shown in FIG. 3 such that the second gate electrode layer 420 and the third semiconductor fin 330 do not overlap each other.

Figure 4:
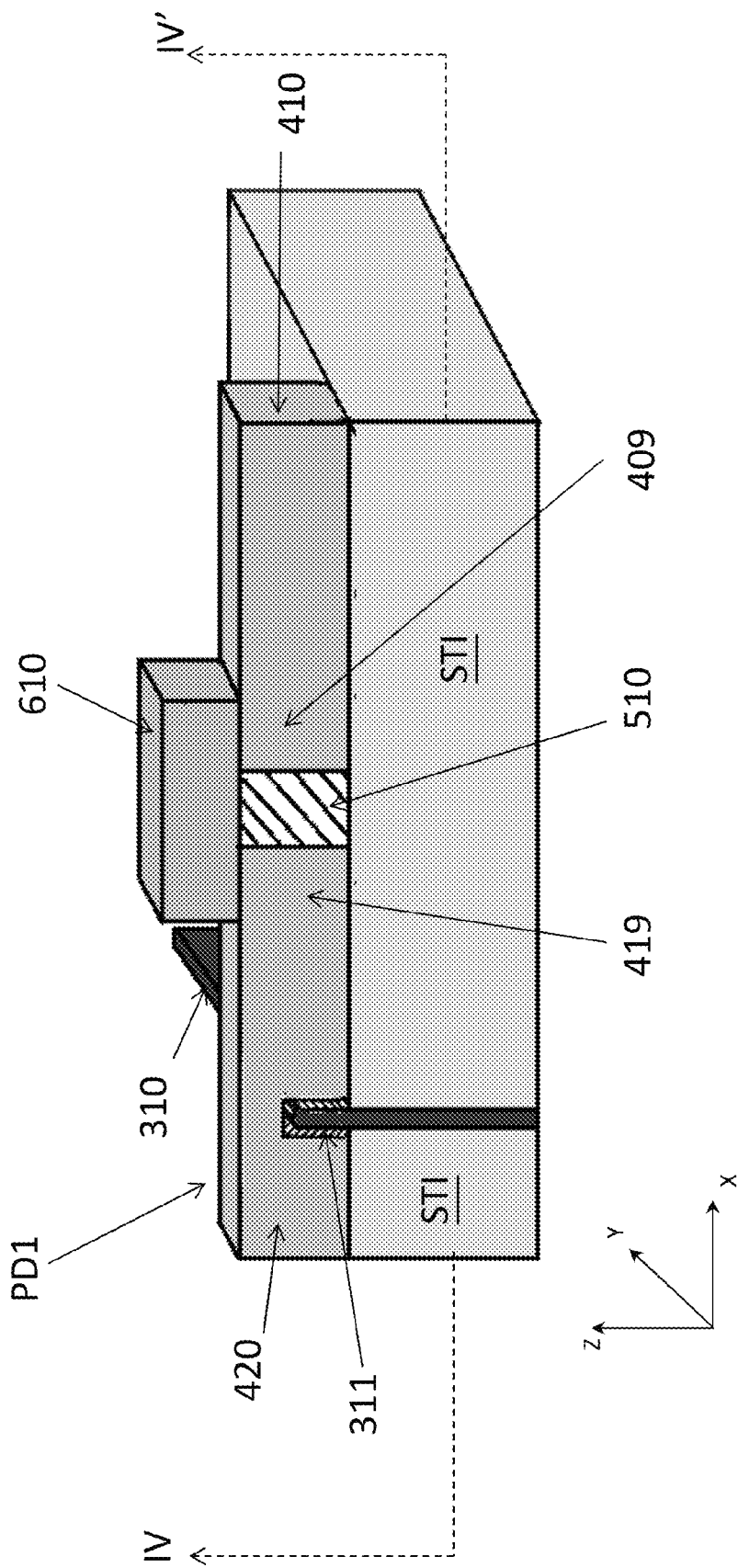
FIG. 4 illustrates an exemplary perspective view of a region in FIG. 3 taken along a plane IV-IV' perpendicular to Y axis.

Referring to FIG. 3 and FIG. 4 which illustrates an exemplary perspective view of a region 811 in FIG. 3 taken along a plane IV-IV' perpendicular to Y axis, a first interconnection layer 610 is formed over two end portions 409 and 419 of the first and second gate electrode layers 410 and 420. The two end portions 409 and 419 of the first and second gate electrode layers 410 and 420 face each other and are separated by the first dielectric layer 510 filling the space therebetween. The first and second gate electrode layers 410 and 420 are electrically connected by the first interconnection layer 610 formed on the two end portions 409 and 419 of the first and second gate electrode layers 410 and 420 and also on the dielectric layer 510.

As shown in FIG. 4, a channel region of the first pull-down transistor PD1 and the second gate electrode layer 420 formed thereover are electrically isolated from each other by a gate insulating layer 311. According to one embodiment, although not shown, the gate insulating layer 311 can extend from the first semiconductor fin 310 in a direction parallel to X axis so as to cover a portion of STI. Thus, the gate insulating layer 311 can further extend to cover another channel region the first pull-down transistor PD1, when the first pull-down transistor PD1, as well as the first pass-gate transistor PG1, includes two parallel channel regions, source regions, and drain regions formed of two parallel semiconductor fins as shown in FIG. 3.

Referring back to FIG. 3, a second interconnection layer 620, which is formed over an end portion of the third gate electrode layer 430 opposite to an end thereof facing the second gate electrode layer 420, electrically connects the third gate electrode layer 430 to a write wordline (see WWL in FIG. 1) disposed over the 8T SRAM cell 10.

The first interconnection structure 850 includes the first metal contact 710 and a third interconnection layer 630. The first metal contact 710 covers and is electrically connected to the coupled drain regions of the second pull-down transistor PD2 and the second pass-gate transistor PG2 and to the drain region of the second pull-up transistor PU2. The third interconnection layer 630 is electrically connected to an end of the second gate electrode layer 420 and an end of the first metal contact 710. According to one embodiment, the third interconnection layer 630 is formed above the second gate electrode layer 420 and above the first metal contact 710. Thus, the drain regions of second pull-down transistor PD2, the second pass-gate transistor PG2, and the second pull-up transistor PU2, and the second gate electrode layer 420 that acts as the gate electrodes of the first pull-up transistor PU1 and the first pull-down transistor PD1, are electrically connected to each other through the first interconnection structure 850. As set forth above, the second gate electrode layer 420 and the first gate electrode layer 410 that acts as the gate electrode of the read pull-down transistor RPD are electrically connected to each other through the first interconnection layer 610.

As show in FIG. 3, the 8T SRAM cell 10 further includes fourth through sixth gate electrode layers 440, 450, and 460 aligned to each other, which can be formed by cutting the same gate layer extending linearly along X axis during manufacturing. The fourth gate electrode layer 440 formed over the channel region of the read pass-gate transistor RPG, and the fifth gate electrode layer 450 formed over the channel region of the first pass-gate transistor PG1, are electrically isolated from each other and separated by the first dielectric layer 510 filling a space therebetween. The fifth gate electrode layer 450 and the sixth gate electrode layer 460 formed over the channel regions of the second pull-up transistor PU2 and the second pull down transistor PD2, are electrically isolated and separated from each other by a fourth dielectric layer 540 filling a space therebetween. Further, the fourth gate electrode layer 440 extends from the fourth boundary 304, while the sixth gate electrode layer 460 is spaced apart from the third boundary 303 by a third dielectric layer 550 traversing the third boundary 303. As shown in FIG. 3, the sixth gate electrode layer 460 covers (but is not electrically connected to) the drain region of the first pull-up transistor PU1. The present disclosure is not limited thereto. According to another embodiment, the second semiconductor fin 320 has a shorter length in Y axis than that is shown in FIG. 3 such that the sixth gate electrode layer 460 and the second semiconductor fin 320 do not overlap each other.

The first through fourth dielectric layers 510 through 550 can be formed at the level of the gate electrode layer and are made of SiN, SiO$_2$, or any other suitable materials, which is different from a dielectric layer covering and isolating gate electrodes.

Referring still to FIG. 3, a fourth interconnection layer 640 traversing the fourth boundary 304 and formed over an end portion of the fourth gate electrode layer 440 electrically connects the fourth gate electrode layer 440 to a read wordline (see RWL in FIG. 1) disposed over the 8T SRAM cell 10. A fifth interconnection layer 650, which is formed over an end portion of the fifth gate electrode layer 450 adjacent to the first dielectric layer 510, electrically connects the fifth gate electrode layer 650 to the write wordline (see WWL in FIG. 1) disposed over the 8T SRAM cell 10.

The second interconnection structure 860 includes the second metal contact 720 and a sixth interconnection layer 660. The second metal contact 720 covers and is electrically connected to the coupled drain regions of the first pull-down transistor PD1 and the first pass-gate transistor PG1 and to the drain region of the first pull-up transistor PU1. The sixth interconnection layer 660 is electrically connected to an end of the sixth gate electrode layer 460 and an end of the second metal contact 720. According to one embodiment, the sixth interconnection layer 660 is formed above the sixth gate electrode layer 460 and above the second metal contact 720. Thus, the drain regions of first pull-down transistor PD1, the first pass-gate transistor PG1, and the first pull-up transistor PU1, and the sixth gate electrode layer 460 that acts as the gate electrodes of the second pull-up transistor PU2 and the second pull-down transistor PD2, are electrically connected to each other through the second interconnection structure 860.

According to the present embodiment, the first through sixth gate electrode layers 410, 420, 430, 440, 450, and 460 are formed of a same metal layer during manufacturing. Thus, each of the first through sixth gate electrode layers is formed at the same level with reference to the surface of the substrate on which the SRAM cell 10 is formed and contains the same material such as tungsten and/or functional metals.

According to the present embodiment, the first through sixth interconnection layers 610, 620, 630, 640, 650, and 660 are formed of a same metal layer during manufacturing. Thus, each of the interconnection layers is formed at the same level with reference to the surface of the substrate and contains the same material such as tungsten, cobalt, copper, and a combination thereof. Each of the first through sixth interconnection layers can directly contact a portion of the respective gate electrode layer so as to make an electrical connection thereof and a portion of the respective metal contact so as to make an electrical connection thereof.

As shown in FIG. 3, at the level of the gate electrode layers, the second gate electrode layer 420 and the first gate electrode layer 410 are separated from each other by the first dielectric layer 510. The second gate electrode layer 420 and the sixth gate electrode layer 460 are symmetric with respect to a geometric center C of the first pull-up transistor PU1 and the second pull-down transistor PU2. The geometric center C is located on a line L connecting the first and second pull-up transistors PU1 and PU2 (at the center of the channel) and has the same distance to the first and second pull-up transistors PU1 and PU2. Accordingly, Vccmin, a minimum supply voltage required to operate the SRAM including a plurality of SRAM cells 10, can be lowered, comparing to a comparative SRAM including a plurality of SRAM cells each of which includes a single continuous gate electrode layer that acts as gate electrodes of a first pull-up transistor, a first pull-down transistor, and a read pull-down transistor at the level of the gate electrode layers, as in the comparative SRAM, the gate electrode layer in each 8T SRAM cell has asymmetric layout to directly connect the gate electrodes of the first pull-down transistor and the read pull-down transistor.

Referring to FIG. 3, the third gate electrode layer 430 and the fifth gate electrode layer 450 are symmetric with respect to the geometric center C of the first pull-up transistor PU1 and the second pull-down transistor PU2.

Still referring to FIG. 3, the third metal contact 730 which electrically connects the source region of the first pull-down transistor to the first power supply node (see Vss in FIG. 1), and the ninth metal contact 790 which electrically connects the source region of the read pull-down transistor to the first power supply node (see Vss n FIG. 1), are spaced apart from each other by a space 801 and are formed of two discrete metal patterns. In the present embodiment, a distance S1 from an end of the third metal contact 730 facing the ninth metal contact 790 to the first semiconductor fin 310 is less than a shortest distance S2 from the first interconnection layer 610 to the first semiconductor fin 310, and a distance S3 from an end of the ninth metal contact 790 facing the third metal contact 730 to the fifth semiconductor fin 350 is less than a shortest distance S4 from the first interconnection layer 610 to the fifth semiconductor fin 350. Accordingly, misalignment of the first interconnection layer 610 in Y axis would not cause a short-circuit between the first interconnection layer 610 and any one of the third metal contact 730 and the ninth metal contact 790.

Figure 5:
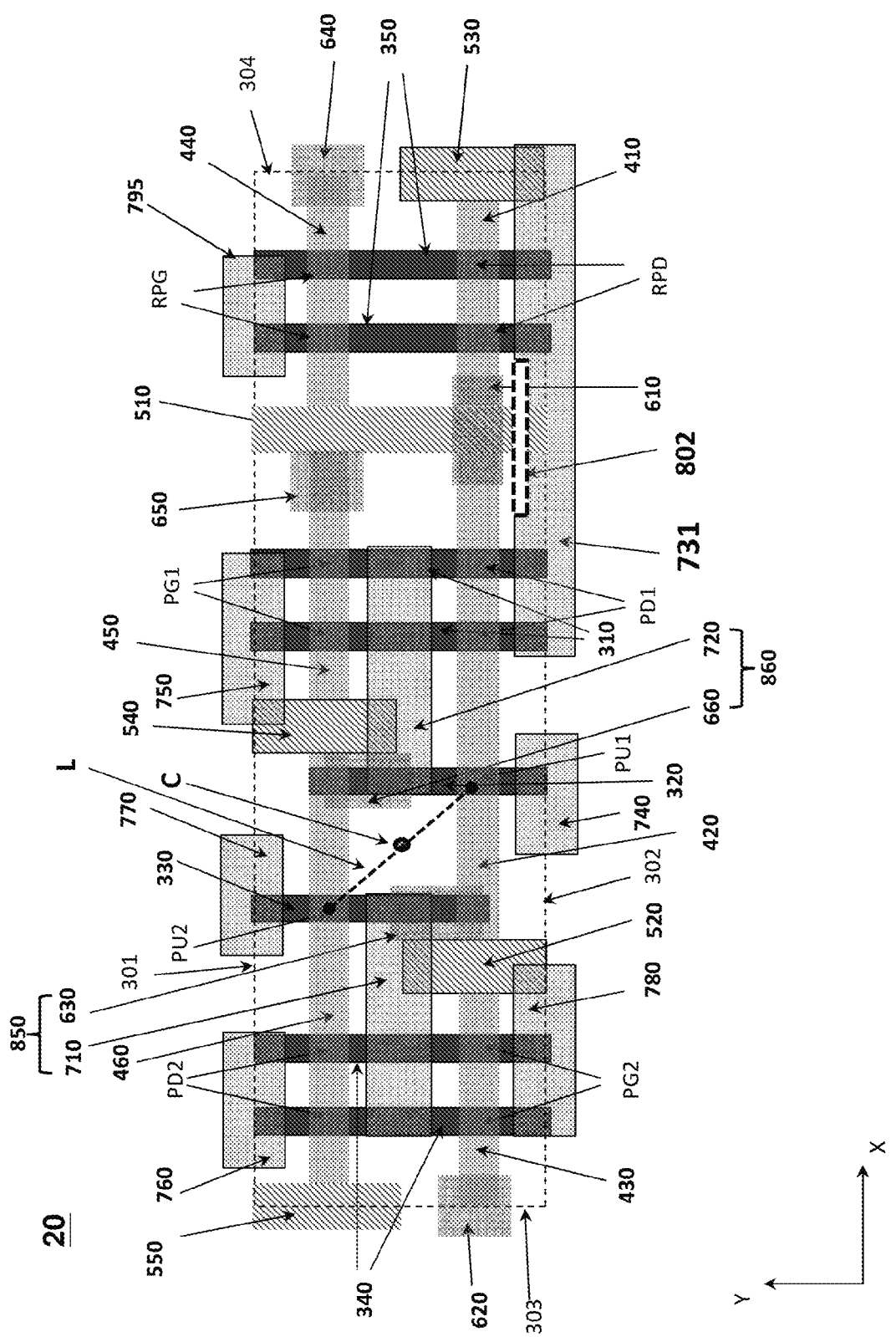
FIG. 5 illustrates an exemplary simplified layout of an 8T SRAM cell according to another embodiment of the present disclosure.

FIG. 5 illustrates an exemplary simplified layout of an 8T SRAM cell according to another embodiment of the present disclosure, in which only a layout of semiconductor fins, gate electrodes/layers, metal contacts formed on the semiconductor fins, and interconnection layers formed over the gate electrode/layers is illustrated. The structure, configuration, materials and/or operation of the foregoing embodiment may be employed in this embodiment, and the detailed explanations may be omitted.

An SRAM cell 20 according to the present embodiment is substantially the same as the aforementioned SRAM cell 10, except that a single continuous metal contact 731 in SRAM cell 20 replaces the discrete third and ninth metal contacts 730 and 790 in the SRAM cell 10. To avoid redundancy, an overlap description will be omitted.

Referring to FIG. 5, the single continuous metal contact 731 electrically connect the source regions of the first pull-down transistor PD1 and the read pull-down transistor RPD to the first power supply node (Vss in FIG. 1) formed over the SRAM cell 20. A recess 802 is formed in the single continuous metal contact 731 so as to increase a distance from the first interconnection layer 610 to the single continuous metal contact 731, in order to prevent or reduce a risk of short-circuit due to misalignment of the first interconnection layer 610.

Figure 6:
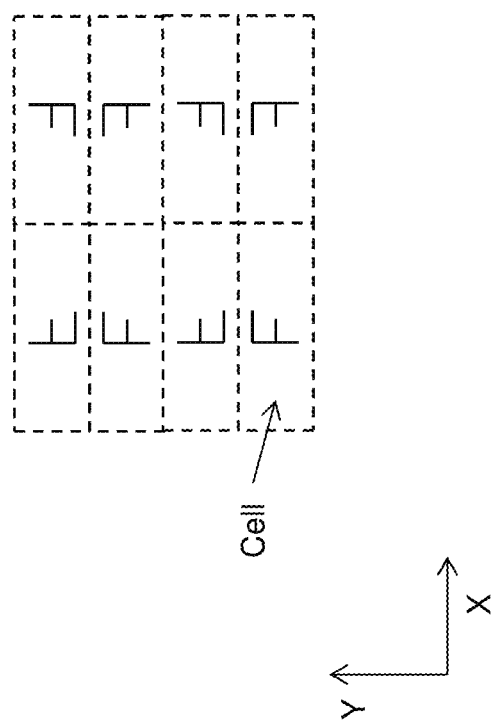
FIG. 6 shows an exemplary SRAM array according to an embodiment the present disclosure.

FIG. 6 shows an SRAM array according to an embodiment the present disclosure. It should be appreciated that the SRAM having the size of 2×4 shown in FIG. 6 is merely an example; the SRAM, however, can have more or few memory cells. As shown in FIG. 6, a plurality of 8T SRAM cells are integrated to form an SRAM array in which boundaries of adjacent SRAM cells are overlapped with each other so that the adjacent SRAM cells are symmetric to each other with reference to the overlapped boundaries. In such an SRAM array, wordlines of the SRAM cells in the same row of the array may be connected to each other, bitlines of the SRAM cells in the same column of the array may be connected to each other, and power supply nodes of the SRAM cells in the same row or the same column can be connected to each other.

FIG. 7 shows a flowchart of a method for manufacturing an SRAM array according to an embodiment of the present disclosure. It is understood that additional steps can be provided before, during, and after various steps illustrated by FIG. 7, and some of the steps described below can be replaced or eliminated. The order of the operations/steps may be interchangeable.

In S710, semiconductor fins, having the foregoing layout, configuration and structures, are first formed in a semiconductor substrate. In S720, various layers, such as gate electrode layers and gate insulating layers, of transistors, having the foregoing layout, configuration and structures, are formed over the semiconductor fins. In S730, the gate electrode layer that act as gate electrodes of the foregoing first pull-down transistor and read pull-down transistor is cut such that the gate electrode layer is divided into two discrete portions spaced-apart from each other. In S740, the foregoing dielectric layer fills the space between the divided portions of the gate electrode layer. Thereafter, in S750, the foregoing interconnection layer is formed on the dielectric layer and also on the divided portions of the gate electrode layer such that the divided portions of the gate electrode layer are electrically connected to each other through the interconnection layer. Subsequently, in S760, vias and metal wirings are formed so as to complete the SRAM array.

According to an aspect of the present disclosure, Vccmin, a minimum supply voltage required to operate an SRAM array including a plurality of SRAM cells each of which includes, at the level of the gate electrode layers, one gate electrode layer that acts as gate electrodes of a first pull-up transistor and a first pull-down transistor and another different gate electrode layer that acts as a gate electrode of a read pull-down transistor, can be lowered, comparing to a comparative SRAM array including a plurality of SRAM cells each of which includes a single continuous gate electrode layer that acts as gate electrodes of a first pull-up transistor, a first pull-down transistor, and a read pull-down transistor at the level of the gate electrode layers, as in the comparative SRAM, the gate electrode layer in each 8T SRAM cell has asymmetric layout to directly connect the gate electrodes of the first pull-down transistor and the read pull-down transistor.

According to one aspect of the present disclosure, a Static Random Access Memory (SRAM) cell includes a first gate electrode layer covering a channel region of a read pull-down transistor, a second gate electrode layer covering channel regions of a first pull-down transistor and a first pull-up transistor, a third gate electrode layer covering a channel region of a second pass-gate transistor, a fourth gate electrode layer covering a channel region of a read pass-gate transistor, a fifth gate electrode layer covering a channel region of a first pass-gate transistor, and a sixth gate electrode layer covering channel regions of a second pull-down transistor and a second pull-up transistor. The first pull-up transistor and the first pull-down transistor forms a first inverter. The second pull-up transistor and the second pull-down transistor forms a second inverter cross-coupled with the first inverter to store data written through the first and second pass-gate transistors. The read pass-gate transistor and the read pull-down transistor are serially connected and form a read port to access data stored by the cross-coupled first and second inverters. The first and second gate electrode layers are separated from each other by a first dielectric layer interposed therebetween, and are electrically connected to each other by a first interconnection layer formed at a level different from the first and second gate electrode layers with respect to a surface of a substrate on which the SRAM cell is formed.

According to another aspect of the present disclosure, a Static Random Access Memory (SRAM) cell includes a first gate electrode layer covering a channel region of a read pull-down transistor, a second gate electrode layer covering channel regions of a first pull-down transistor and a first pull-up transistor, a third gate electrode layer covering a channel region of a second pass-gate transistor, a fourth gate electrode layer covering a channel region of a read pass-gate transistor, a fifth gate electrode layer covering a channel region of a first pass-gate transistor, and a sixth gate electrode layer covering channel regions of a second pull-down transistor and a second pull-up transistor. The first pull-up transistor and the first pull-down transistor forms a first inverter. The second pull-up transistor and the second pull-down transistor forms a second inverter cross-coupled with the first inverter to store data written through the first and second pass-gate transistors. The read pass-gate transistor and the read pull-down transistor are serially connected and form a read port to access data stored by the cross-coupled first and second inverters. The second and sixth gate electrode layers are symmetric to each other with respect to a geometric center of the first and second pull-up transistors.

According to another aspect of the present disclosure, a Static Random Access Memory (SRAM) cell includes a first pull-up transistor and a first pull-down transistor;

a second pull-up transistor and a second pull-down transistor, first and second pass-gate transistors, and a read pull-down transistor and a read pass-gate transistor. Drain regions of the first pull-up transistor, the first pull-down transistor, and the first pass-gate transistor, and gate electrodes of the second pull-up transistor and the second pull-down transistor, are electrically connected to each other. Drain regions of the second pull-up transistor and the second pull-down transistor, gate electrodes of the first pull-up transistor, the first pull-down transistor, and the first pass-gate transistors, and a gate electrode of the read pull-down transistor, are electrically connected to each other. The gate electrodes of the first pull-up transistor, the first pull-down transistor, and the first pass-gate transistors, and the gate electrode of the read pull-down transistor, are electrically connected to each other through an interconnection layer formed over a dielectric layer separating the gate electrodes of the first pull-up transistor, the first pull-down transistor, and the first pass-gate transistors, and the gate electrode of the read pull-down transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Static Random Access Memory (SRAM) cell, comprising:
   a first gate electrode layer covering a channel region of a read pull-down transistor;
   a second gate electrode layer covering channel regions of a first pull-down transistor and a first pull-up transistor;
   a third gate electrode layer covering a channel region of a second pass-gate transistor;
   a fourth gate electrode layer covering a channel region of a read pass-gate transistor;
   a fifth gate electrode layer covering a channel region of a first pass-gate transistor; and
   a sixth gate electrode layer covering channel regions of a second pull-down transistor and a second pull-up transistor,
   wherein the first pull-up transistor and the first pull-down transistor form a first inverter, the second pull-up transistor and the second pull-down transistor form a second inverter cross-coupled with the first inverter to store data written through the first and second pass-gate transistors, and the read pass-gate transistor and the read pull-down transistor are serially connected and form a read port to access data stored by the cross-coupled first and second inverters,
   the first and second gate electrode layers are separated from each other by a first dielectric layer interposed therebetween, and are electrically connected to each other by a first interconnection layer formed at a level different from the first and second gate electrode layers with respect to a surface of a substrate on which the SRAM cell is formed,
   the first dielectric layer extends continuously from a space between the first and second gate layers to a space between the fourth and fifth gate electrodes layers, and separates the fourth and fifth gate electrode layers from each other,
   the first and second pull-up transistors are P-type transistors, and
   the first and second pull-down transistors, the first and second pass-gate transistors, the read pull-down transistor, and the read pass-gate transistor are N-type transistors.

2. The SRAM cell of claim 1, wherein the second and sixth gate electrode layers are symmetric to each other with respect to a geometric center of the first and second pull-up transistors.

3. The SRAM cell of claim 2, wherein the geometric center of the first and second pull-up transistors is on a line connecting the first and second pull-up transistors and has a same distance to the first and second pull-up transistors.

4. The SRAM cell of claim 1, wherein the first interconnection layer is formed over the first and second gate electrode layers and the first dielectric layer.

5. The SRAM cell of claim 1, further comprising:
   a first metal contact layer electrically connecting drain regions of the second pull-down transistor and the second pull-up transistor to each other;
   a second metal contact layer electrically connecting drain regions of the first pull-down transistor and the first pull-up transistor to each other;
   a third metal contact layer electrically connecting a drain region of the second pull-down transistor to a first power supply node;

a fourth metal contact electrically connecting a source region of the first pull-up transistor to a second power supply node;
a fifth metal contact electrically connecting a source region of the first pass-gate transistor to a first bitline;
a sixth metal contact electrically connecting a source region of the second pull-down transistor to the write wordline;
a seventh metal contact electrically connecting a source of the second pull-up transistor to the second power supply node;
an eighth metal contact electrically connecting a source region of the second pass-gate transistor to a second bitline;
a ninth metal contact electrically connecting a source of the read pull-down transistor to the first power supply node; and
a tenth metal contact electrically connecting a source of the read pass-gate transistor to a read bitline.

6. The SRAM cell of claim 5, wherein the first and second metal contact layers are spaced apart from each other.

7. The SRAM cell of claim 5, wherein each metal contact is made of one selected from the group consisting of tungsten, cobalt, copper, and a combination thereof.

8. The SRAM cell of claim 5, further comprising:
a second interconnection layer electrically connecting the third gate electrode layer to a write wordline;
a third interconnection layer electrically connecting the second gate electrode layer to the first metal contact;
a fourth interconnection layer electrically connecting the fourth gate electrode layer to a read wordline;
a fifth interconnection layer electrically connecting the fifth gate electrode layer to the write wordline; and
a sixth interconnection layer electrically connecting the sixth gate electrode layer to the second metal contact.

9. The SRAM cell of claim 8, wherein each interconnection layer is made of one selected from the group consisting of tungsten, cobalt, copper, and a combination thereof.

10. The SRAM cell of claim 1, further comprising a single continuous metal contact electrically connecting source regions of the first pull-down transistor and the read pull-down transistor to a first power supply node.

11. The SRAM cell of claim 10, wherein the single continuous metal contact includes a recess recessed in a direction away from the first gate layer contact.

12. The SRAM cell of claim 1, wherein:
the first through third gate electrode layers are spaced apart from each other and each extend linearly along a direction parallel to a first direction, and
the fourth through sixth gate electrode layers are spaced apart from each other and each extend linearly along a direction parallel to the first direction.

13. The SRAM cell of claim 1, wherein:
the second and third gate electrode layers are separated from each other by a second dielectric layer, and
the fifth and sixth gate electrode layers are separated from each other by a third dielectric layer.

14. The SRAM cell of claim 1, wherein:
source, drain, and channel regions of the first pull-down transistor and the first pass-gate transistor are made of a first semiconductor fin protruding from the surface of the substrate,
source, drain, and channel regions of the first pull-up transistor are made of a second semiconductor fin protruding from the surface of the substrate,
source, drain, and channel regions of the second pull-up transistor are made of a third semiconductor fin protruding from the surface of the substrate,
source, drain, and channel regions of the second pull-down transistor and the second pass-gate transistor are made of a fourth semiconductor fin protruding from the surface of the substrate,
source, drain, and channel regions of the read pass-gate transistor and the read pull-down transistor are made of a fifth semiconductor fin protruding from the surface of the substrate, and
the first through fifth semiconductor fins are parallel to each other.

15. A Static Random Access Memory (SRAM) cell, comprising:
a first gate electrode layer covering a channel region of a read pull-down transistor;
a second gate electrode layer covering channel regions of a first pull-down transistor and a first pull-up transistor;
a third gate electrode layer covering a channel region of a second pass-gate transistor;
a fourth gate electrode layer covering a channel region of a read pass-gate transistor;
a fifth gate electrode layer covering a channel region of a first pass-gate transistor; and
a sixth gate electrode layer covering channel regions of a second pull-down transistor and a second pull-up transistor,
wherein the first pull-up transistor and the first pull-down transistor form a first inverter, the second pull-up transistor and the second pull-down transistor form a second inverter cross-coupled with the first inverter to store data written through the first and second pass-gate transistors, and the read pass-gate transistor and the read pull-down transistor are serially connected and form a read port to access data stored by the cross-coupled first and second inverters,
the second and sixth gate electrode layers are symmetric to each other with respect to a geometric center of the first and second pull-up transistors,
a dielectric layer extends continuously from a space between the first and second gate layers to a space between the fourth and fifth gate electrodes layers, and is in contact with ends of the second and fifth gate electrode layers,
the first and second pull-up transistors are P-type transistors, and
the first and second pull-down transistors, the first and second pass-gate transistors, the read pull-down transistor, and the read pass-gate transistor are N-type transistors.

16. The SRAM cell of claim 15, further comprising a first interconnection layer, formed at a level different from the first and second gate electrode layers with respect to a surface of a substrate on which the SRAM cell is formed, to electrically connect the first and second gate electrode layers.

17. The SRAM cell of claim 15, wherein each transistor is a fin field-effect transistor.

18. A Static Random Access Memory (SRAM) cell, comprising:
a first pull-up transistor and a first pull-down transistor;
a second pull-up transistor and a second pull-down transistor;
first and second pass-gate transistors; and
a read pull-down transistor and a read pass-gate transistor, wherein drain regions of the first pull-up transistor, the first pull-down transistor, and the first pass-gate transistor, and gate electrodes of the second pull-up transistor and the second pull-down transistor, are electrically connected to each other, drain regions of the second pull-up transistor, the second pull-down transistor, and the second pass-gate transistor, gate electrodes of the first pull-up transistor and the first pull-down transistor, and a gate electrode of the read pull-down transistor, are electrically connected to each other, the gate electrodes of the first pull-up transistor and the first pull-down transistor and the gate electrode of the read pull-down transistor are electrically connected to each other through an interconnection layer formed over a continuous dielectric layer which separates the gate electrodes of the first pull-up transistor and the first pull-down transistor and the gate electrode of the read pull-down transistor and which separates a gate electrode of the first pass-gate transistor and a gate electrode of the read pass-gate transistor, the first and second pull-up transistors are P-type transistors, and the first and second pull-down transistors, the first and second pass-gate transistors, the read pull-down transistor, and the read pass-gate transistor are N-type transistors.

19. The SRAM cell of claim 18, wherein each transistor is a fin field-effect transistor.

* * * * *